United States Patent
Prior

(10) Patent No.: US 6,972,497 B2
(45) Date of Patent: Dec. 6, 2005

(54) OPTICAL SEMICONDUCTOR DEVICE AND METHOD OF MANUFACTURE

(75) Inventor: Christophe Prior, Le Versoud (FR)

(73) Assignee: STMicroelectronics S.A., (FR)

( * ) Notice: Subject to any disclaimer, the term of this patent is extended or adjusted under 35 U.S.C. 154(b) by 0 days.

(21) Appl. No.: 10/359,049

(22) Filed: Feb. 5, 2003

(65) Prior Publication Data

US 2004/0065952 A1    Apr. 8, 2004

(30) Foreign Application Priority Data

Feb. 6, 2002  (FR) .................................. 02 01429

(51) Int. Cl.$^7$ ............................................. H01L 23/28
(52) U.S. Cl. ..................................... 257/788; 257/730
(58) Field of Search .......................... 257/680, 81, 780, 257/778, 784, 777, 729, 730, 731, 788

(56) References Cited

U.S. PATENT DOCUMENTS

| | | | |
|---|---|---|---|
| 5,138,145 A | 8/1992 | Nakamura et al. | ........ 250/208.1 |
| 5,773,323 A | 6/1998 | Hur | ............................ 438/123 |
| 5,783,815 A | 7/1998 | Ikeda | ...................... 250/208.1 |
| 5,786,589 A | 7/1998 | Segawa et al. | .......... 250/208.1 |
| 6,117,193 A | 9/2000 | Glenn | ........................ 29/25.01 |
| 6,428,650 B1 * | 8/2002 | Chung | ......................... 156/250 |
| 6,472,247 B1 * | 10/2002 | Andoh et al. | ................. 438/64 |
| 6,566,745 B1 * | 5/2003 | Beyne et al. | ............... 257/680 |

FOREIGN PATENT DOCUMENTS

| | | |
|---|---|---|
| EP | 0 682 374 | 11/1995 |
| WO | WO 01/91193 | 11/2001 |

OTHER PUBLICATIONS

French Preliminary Search Report, FA 616385/FR 0201429, dated Oct. 29, 2002.

* cited by examiner

Primary Examiner—Howard Weiss
Assistant Examiner—(Vikki) Hoa B. Trinh
(74) Attorney, Agent, or Firm—Jenkens & Gilchrist, PC

(57) ABSTRACT

An optical semiconductor product includes an integrated circuit chip having an optical sensor in its front face. The chip is attached to a support plate and electrical interconnection is made therebetween. A protective ring is fastened to the front face of the chip, around and at some distance from the optical sensor. A ring of encapsulating material is deposited to surround the periphery of the chip and lie between the front face of the support plate (2) and the protective ring.

5 Claims, 2 Drawing Sheets

OPTICAL SEMICONDUCTOR DEVICE AND METHOD OF MANUFACTURE

PRIORITY CLAIM

The present invention claims priority from French Application for Patent No. 0201429 filed Feb. 6, 2002, the disclosure of which is hereby incorporated by reference.

BACKGROUND OF THE INVENTION

1. Technical Field of the Invention

The present invention relates to the field of optical semiconductor devices and more particularly to the packaging of integrated circuit chips with optical sensors.

2. Description of Related Art

Before using integrated circuit chips in a standard manner, it is known to mount them in packages having cavities, to the bottom of which the chips are adhesively bonded. Where the integrated circuit chips have an optical sensor in their front face, the front wall of the cavity of the package consists of a transparent window.

The aim of the present invention is to provide a mounting for an integrated circuit chip with an optical sensor which is very different from those generally known in the art.

SUMMARY OF THE INVENTION

In accordance with one embodiment of the present invention, an optical semiconductor device comprises an integrated circuit chip having an optical sensor in its front face, a support plate to one front face of which is fastened the rear face of the chip and means for electrically connecting the chip to the support plate.

This device may further comprise a protective ring fastened to the front face of the chip, around and at some distance from the optical sensor, and an encapsulation ring made of an encapsulation material surrounding the periphery of the chip and lying between the front face of the support plate and the said protective ring.

The electrical connection means provided in the device preferably comprises linking wires connected, on the one hand, to electrical connection pads produced on the front face of the chip, at the periphery of the said protective ring and, on the other hand, to electrical connection pads of the front face of the support plate, these wires being embedded in the said encapsulation ring.

The optical semiconductor device according to the invention may advantageously comprise an auxiliary ring fastened to the front face of the support plate, at some distance from the periphery of the chip, the said encapsulation ring extending to this auxiliary ring.

The optical semiconductor device may further advantageously include an annular lens holder fastened to the protective ring or incorporating the encapsulation ring.

The optical semiconductor device may further advantageously include a window placed in front of the front face of the chip and supported by the protective ring. The window is preferably supported by an annular window holder fastened to the protective ring or incorporating the protective ring.

The present invention is also a method of fabricating an optical semiconductor device comprising an integrated circuit chip having an optical sensor in its front face, a support plate, to one front face of which is fastened the rear face of the chip and means for electrically connecting the chip to the support plate.

The method of the present invention comprises the steps of: fastening a protective ring to the front face of the chip, around and at some distance from the optical sensor; and depositing an encapsulation material surrounding the periphery of the chip and lying between the front face of the support plate and the said protective ring so as to constitute an encapsulation ring.

The method may further advantageously comprise the step of, before the operation of depositing the said encapsulation ring, depositing an auxiliary ring on the front face of the support plate, at some distance from the periphery of the chip, the said encapsulation ring extending to this auxiliary ring.

The method may still further advantageously comprise the step of fastening a window and/or a lens holder to the said protective ring.

The method may additionally advantageously comprise the step of fastening a window holder and/or a lens holder to the front face of the chip, thereby incorporating the protective ring.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
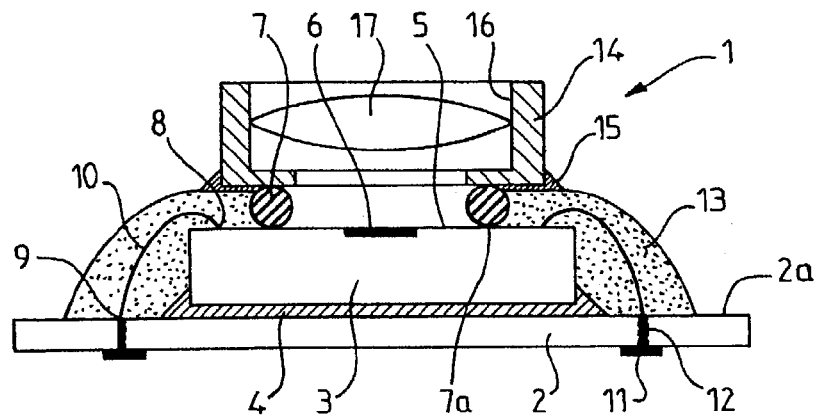
FIG. 1 shows a cross section of a first optical semiconductor device according to the present invention.
Figure 2:
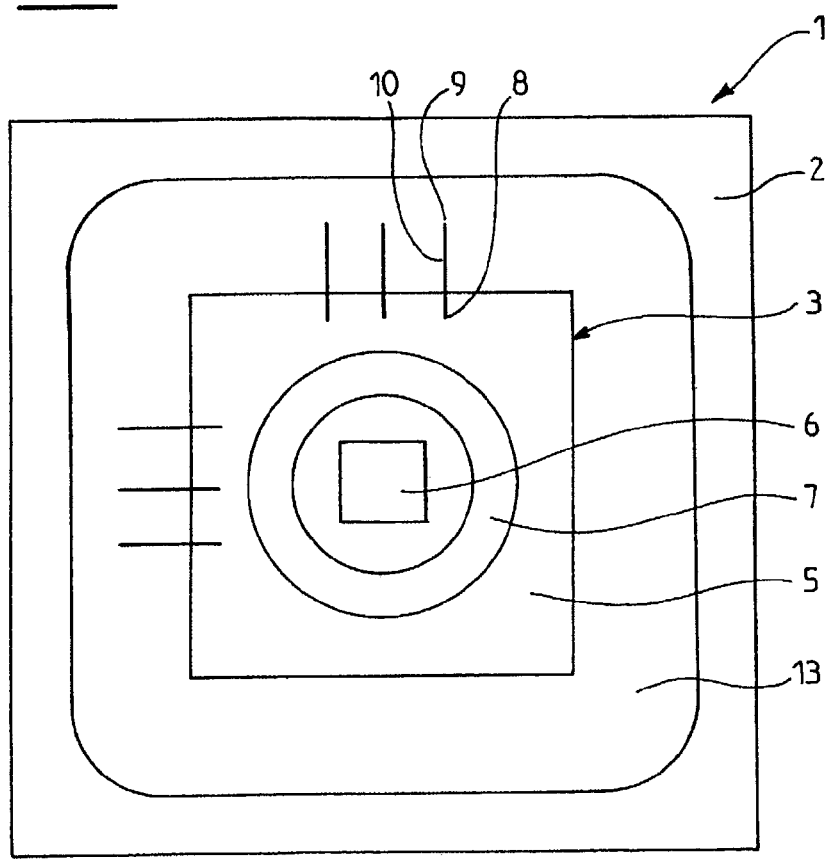
FIG. 2 shows a partial top view of the optical semiconductor device of FIG. 1.

FIGS. 1 and 2 show an optical semiconductor device 1 which comprises a flexible or rigid electrical connection and support plate 2, to the front face 2a of which is fastened the rear face of an integrated circuit chip 3 by means of a layer of adhesive 4, in particular an epoxy adhesive, the central part of the front face 5 of the chip 3 having an optical sensor 6.

A protective ring 7 is fastened to the front face 5 of the chip 3, between and at some distance from the optical sensor 6 and from the peripheral edge of this front face, by means of an annular thread of adhesive 7a. This protective ring 7, which is for example toric, may be made from silicone or from a thermoplastic.

Outside the protective ring 7, the front face 5 of the chip 3 has electrical connection pads 8 which are connected to electrical connection pads 9 provided on the front face 2a of the plate 2 at the periphery and at some distance from the chip 3, by means of electrical linking wires 10. The front electrical connection pads 9 of the plate 2 are, for example, connected to rear electrical connection pads 11 of the plate 2 via an integrated circuit 12.

The optical semiconductor device 1 further comprises an encapsulation ring 13 which surrounds the periphery of the chip 3 and which lies between the front face 2a of the plate 2 and the protective ring 7, the electrical connection wires 10 being embedded in this encapsulation ring 13.

The encapsulation ring 13 is preferably made from an epoxy/anhydride resin with a very high impermeability and a low expansion coefficient, it being possible for this resin to be filled with amorphous silica particles.

The optical semiconductor device 1 further comprises an annular lens holder 14, the rear face of which is fastened to the protective ring 7 and/or to the front face of the encapsulation ring 13 by means of a layer of adhesive 15, the lens holder 14 having a passage 16 in which an optical lens 17 is fitted, such that the latter lies so as to face and at some distance from the optical sensor 6 of the chip 3.

Preferably, the front face of the encapsulation ring 13 is located slightly back from the top of the protective ring 7.

In order to fabricate the optical semiconductor device 1, it is possible to proceed as follows.

The chip 3 is fastened to the support plate 2 by means of the previously deposited layer of adhesive 4.

The electrical connection wires 10 are mounted and then the protective ring 7 is adhesively bonded to the front face 5 of the chip 3. In a variant, these two operations could be reversed.

The material forming the protective ring 13 is deposited in liquid form and this material is made to cure by placing the assembly in an oven.

Finally, the lens holder 14 is fastened by having previously deposited the layer of adhesive 15.

In an alternative embodiment, a transparent window could be inserted between the protective ring 7 and the lens holder 14 by adhesively bonding it to the protective ring 7 and/or to the encapsulation ring 13 and then adhesively bonding the lens holder 14 to this window.

Figure 3:
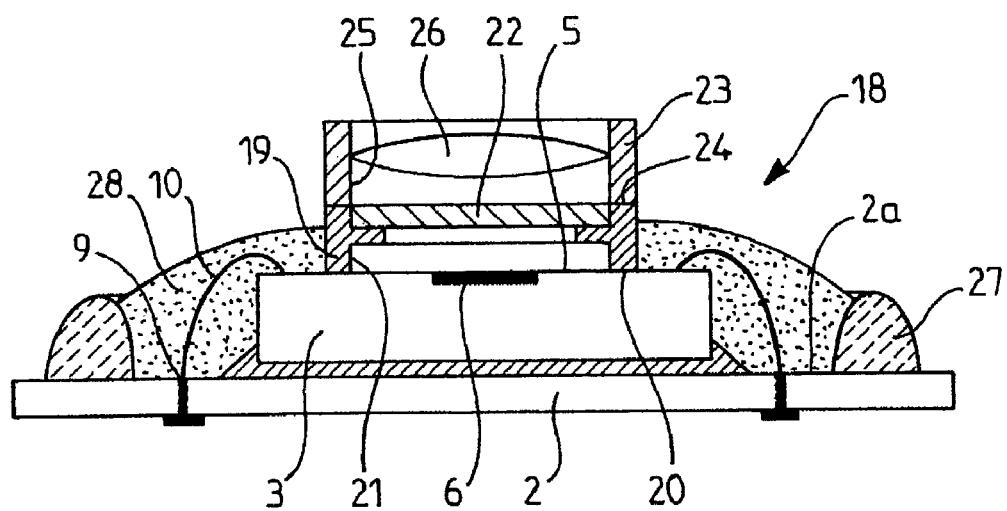
FIG. 3 shows a cross section of a second optical semiconductor device according to the present invention.

FIG. 3 shows an optical semiconductor device 18 which, as in the previous example, comprises an electrical connection and support plate 2, an integrated circuit chip 3 and wires 10 for electrically connecting the chip 3 to the plate 2.

The optical semiconductor device 18 is differentiated from the optical semiconductor device of the previous example by the following points.

The optical semiconductor device 18 comprises an annular window holder 19 which is fastened to the front face 5 of the chip 3 via an annular thread of adhesive 20, at the same location as the protective ring 7 was fastened. This window holder 19 bears, in its central passage 21, a window 22 which lies at some distance from the front face 5 of the chip 3 and therefore from the optical sensor thereof.

An annular lens holder 23 is fastened to the window holder 19 or the window 22 by means of an annular thread of adhesive 24, in the through-passage 25 of which an optical lens 26 is fitted.

The optical semiconductor device 18 furthermore comprises an auxiliary ring 27 which lies over the front face 2a of the plate 2, at the periphery and at some distance from the electrical connection pads 9, and an encapsulation ring 28 which surrounds the periphery of the chip 3 and which lies between, on the one hand, the front face 2a of the plate 2 and the auxiliary ring 27 and, on the other hand, the periphery of the window holder 19, the electrical wires 10 being embedded in this encapsulation ring 28.

The encapsulation ring 28 corresponds to the encapsulation ring 13 of the previous example while the auxiliary ring 27 is preferably made from a highly isotropic epoxy resin.

To fabricate the semiconductor device 18, it is possible to proceed as follows.

After having fastened the chip 3 to the support plate 2 and fitted the electrical connection wires 10, the window holder 19 is fastened to the front face 5 of the chip 2 and the material intended to form the auxiliary ring 27 is deposited, the window holder 19 forming a protective ring. These operations can be carried out in a different order.

After curing the auxiliary ring 27, the material intended to form the encapsulation ring 28 is deposited in its liquid form and, as in the previous example, it is made to cure by placing the assembly in an oven.

Finally, the lens holder 23 is mounted on the window holder 19. In a variant, the lens holder 23 could be fastened before depositing the encapsulation ring 28. It would also be possible to fabricate the window holder 19 and the lens holder 23 as a single part.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An optical semiconductor device comprising:
   an integrated circuit chip having an optical sensor in its front face;
   a support plate to one front face of which is fastened a rear face of the integrated circuit chip;
   means for electrically connecting the integrated circuit chip to the support plate;
   a surrounding protector fastened to the front face of the integrated circuit chip around and at some distance from the optical sensor; and
   an encapsulation ring made of an encapsulation material surrounding the periphery of the chip and lying between the front face of the support plate and the surrounding protector; and
   an auxiliary ring fastened to the front face of the support plate, at some distance from the periphery of the chip, the encapsulation ring filling between the surrounding protector and the auxiliary ring.

2. The device according to claim 1, wherein the electrical connection means comprises linking wires connected, on the one hand, to electrical connection pads produced on the front face of the chip, outside the surrounding protector and, on the other hand, to electrical connection pads of the front face of the support plate, these wires being embedded in the encapsulation ring.

3. The device according to claim 1, further including:
   an annular lens holder associated with the surrounding protector.

4. The device according to claim 3, wherein the annular lens holder includes a window placed in front of the front face of the chip aligned with the optical sensor.

5. The device according to claim 4, wherein the window is carried by an annular window holder associated with the surrounding protector.

* * * * *